US010171918B2

(12) United States Patent
Geiger et al.

(10) Patent No.: US 10,171,918 B2
(45) Date of Patent: Jan. 1, 2019

(54) MEMS MICROPHONE MODULES AND WAFER-LEVEL TECHNIQUES FOR FABRICATING THE SAME

(71) Applicant: Heptagon Micro Optics Pte. Ltd., Singapore (SG)

(72) Inventors: Jens Geiger, Thalwil (CH); Markus Rossi, Jona (CH); Hartmut Rudmann, Jona (CH)

(73) Assignee: Heptagon Micro Optics Pte. Ltd., Singapore (SG)

(*) Notice: Subject to any disclaimer, the term of this patent is extended or adjusted under 35 U.S.C. 154(b) by 0 days.

(21) Appl. No.: 15/788,267

(22) Filed: Oct. 19, 2017

(65) Prior Publication Data

US 2018/0295453 A1 Oct. 11, 2018

Related U.S. Application Data

(63) Continuation of application No. 14/894,059, filed as application No. PCT/SG2014/000227 on May 26, 2014, now Pat. No. 9,826,316.

(60) Provisional application No. 61/829,342, filed on May 31, 2013.

(51) Int. Cl.
| H04R 19/04 | (2006.01) |
| H04R 3/00 | (2006.01) |
| H04R 31/00 | (2006.01) |
| H04R 19/00 | (2006.01) |
| B81C 1/00 | (2006.01) |
| B81B 7/00 | (2006.01) |

(52) U.S. Cl.
CPC ........... *H04R 19/04* (2013.01); *B81B 7/0061* (2013.01); *B81C 1/00873* (2013.01); *H04R 3/00* (2013.01); *H04R 19/005* (2013.01); *H04R 31/00* (2013.01); *B81B 2201/0257* (2013.01); *B81B 2207/012* (2013.01); *B81B 2207/096* (2013.01)

(58) Field of Classification Search
CPC ...... B81B 2201/0257; B81B 2207/012; B81B 7/0061; B81B 2207/015; B81B 2207/096; B81B 7/008; B81C 1/00333; H04R 19/04; H04R 19/005; H04R 2201/003; H04R 2499/11; H04R 31/00; H04R 31/006; H04R 3/005; H04R 3/007
See application file for complete search history.

(56) References Cited

U.S. PATENT DOCUMENTS

| 7,808,060 | B2 | 10/2010 | Hsiao | |
| 7,829,961 | B2* | 11/2010 | Hsiao | H01L 23/3114 |
| | | | | 257/416 |
| 8,199,939 | B2 | 6/2012 | Suvanto et al. | |
| 8,331,589 | B2 | 12/2012 | Wu et al. | |
| 8,368,153 | B2 | 2/2013 | Huang et al. | |
| 8,375,560 | B2* | 2/2013 | Tsai | H04R 31/00 |
| | | | | 29/25.42 |

(Continued)

FOREIGN PATENT DOCUMENTS

CN 202310095 U 7/2012

*Primary Examiner* — Yogeshkumar Patel
(74) *Attorney, Agent, or Firm* — Fish & Richardson P.C.

(57) ABSTRACT

The disclosure describes various MEMS microphone modules that have a small footprint and can be integrated, for example, into consumer electronic or other devices in which space is at premium. Wafer-level fabrication techniques for making the modules also are described.

12 Claims, 10 Drawing Sheets

(56) References Cited

U.S. PATENT DOCUMENTS

| | | | |
|---|---|---|---|
| 8,428,286 B2* | 4/2013 | Fueldner | H04R 19/04 257/416 |
| 8,447,057 B2 | 5/2013 | Goida et al. | |
| 8,472,648 B2 | 6/2013 | Wang et al. | |
| 2004/0038442 A1 | 2/2004 | Kinsman | |
| 2005/0212118 A1 | 9/2005 | Chao et al. | |
| 2007/0272992 A1* | 11/2007 | Mori | H01L 27/0629 257/416 |
| 2008/0137886 A1* | 6/2008 | Schrank | H04R 19/04 381/174 |
| 2008/0217709 A1* | 9/2008 | Minervini | B81B 7/0061 257/416 |
| 2009/0129622 A1 | 5/2009 | Chen et al. | |
| 2009/0218668 A1* | 9/2009 | Zhe | B81C 1/00301 257/680 |
| 2010/0303274 A1* | 12/2010 | Ryan | H04R 1/222 381/361 |
| 2011/0012214 A1* | 1/2011 | Beer | B81C 1/00333 257/418 |
| 2011/0075875 A1* | 3/2011 | Wu | B81C 1/0023 381/361 |
| 2011/0183456 A1* | 7/2011 | Hsieh | B81C 1/00246 438/53 |
| 2012/0082325 A1* | 4/2012 | Sakurauchi | B81C 1/00666 381/174 |
| 2012/0250897 A1* | 10/2012 | Michel | H04R 1/406 381/111 |
| 2012/0319174 A1* | 12/2012 | Wang | B81C 1/00246 257/254 |
| 2014/0217521 A1* | 8/2014 | Johari-Galle | B81C 1/00134 257/415 |
| 2014/0239423 A1* | 8/2014 | Liu | B81C 1/00793 257/417 |
| 2014/0264909 A1* | 9/2014 | Liu | B81C 1/00301 257/774 |
| 2014/0270271 A1* | 9/2014 | Dehe | B81B 3/0018 381/174 |

* cited by examiner

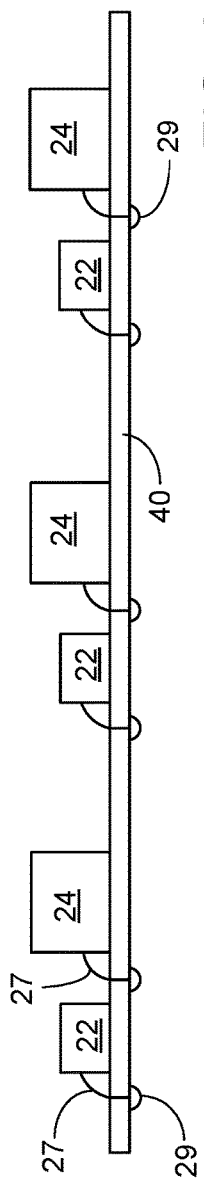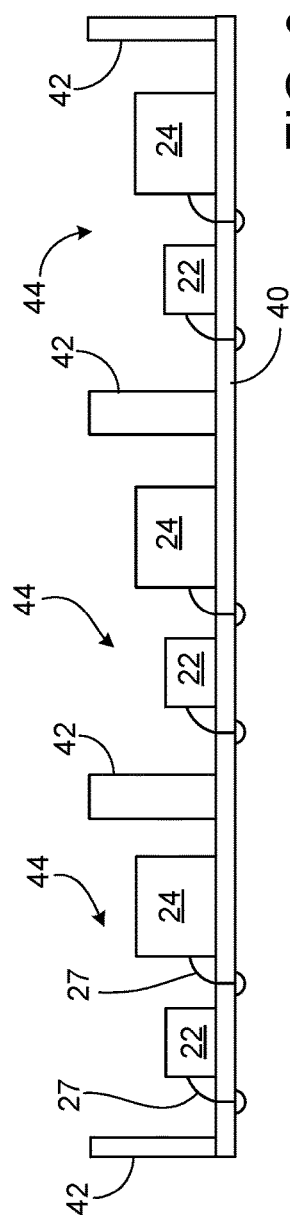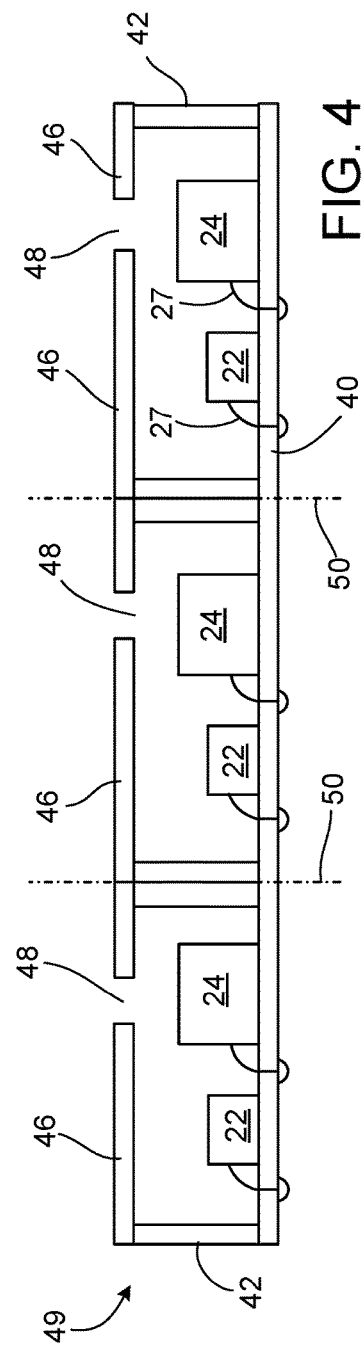

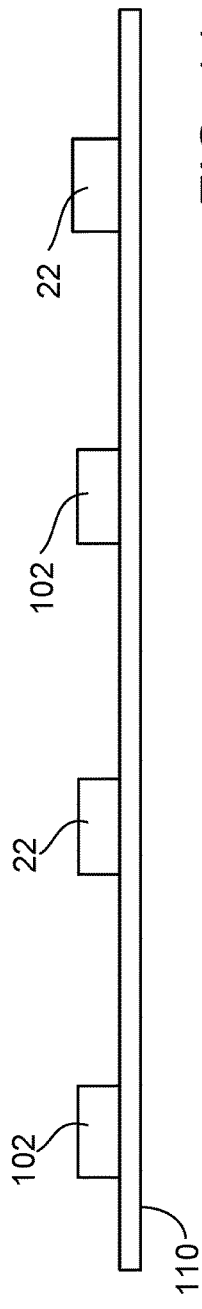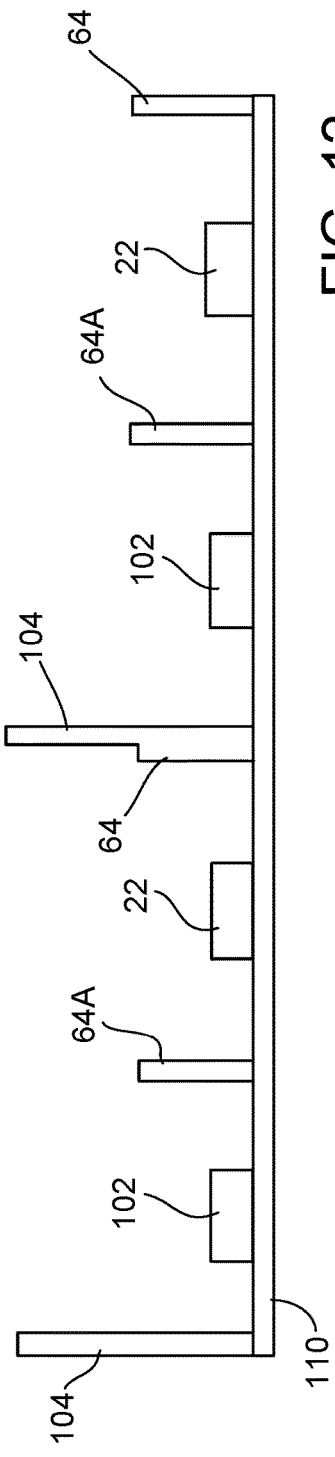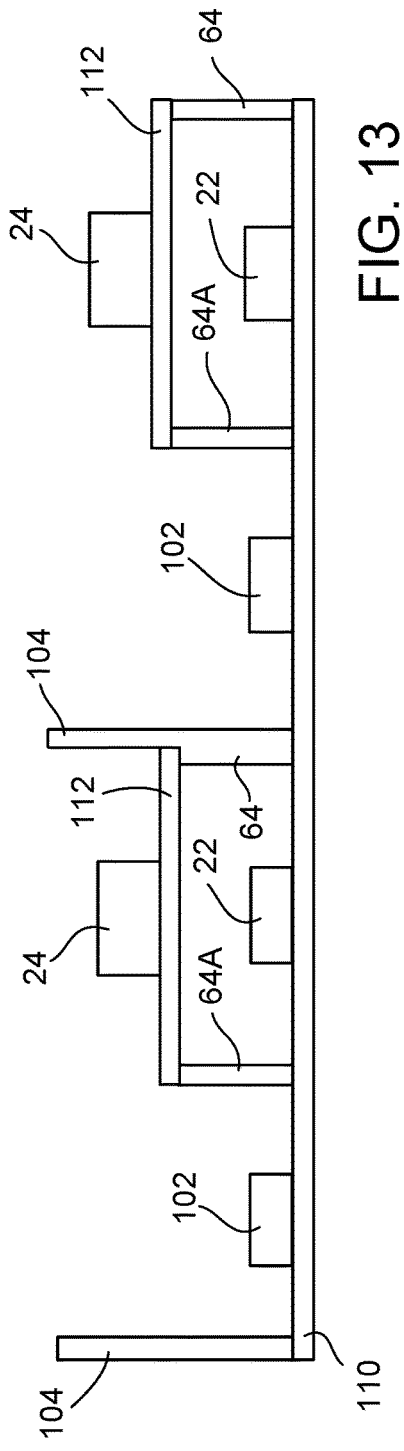

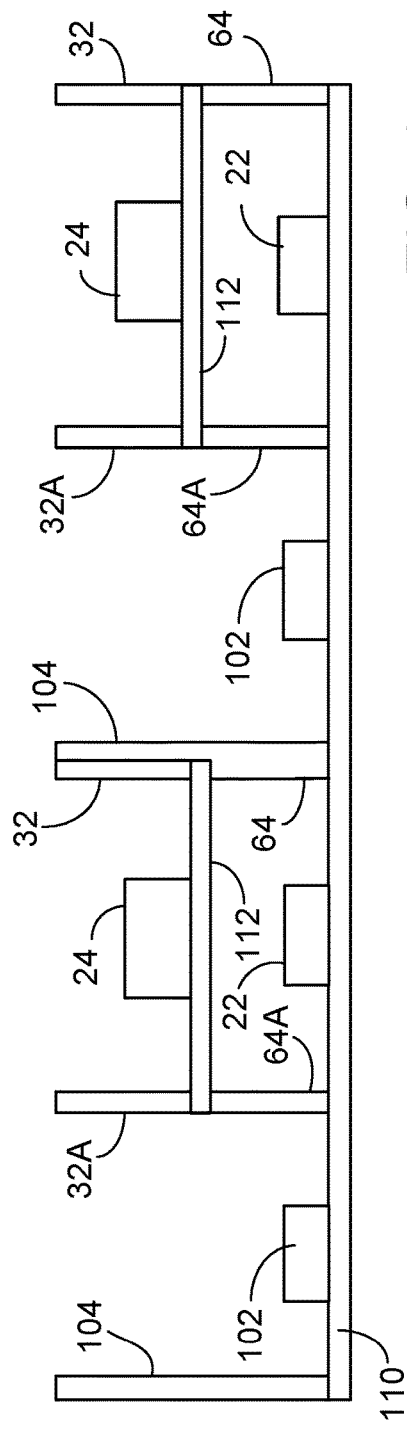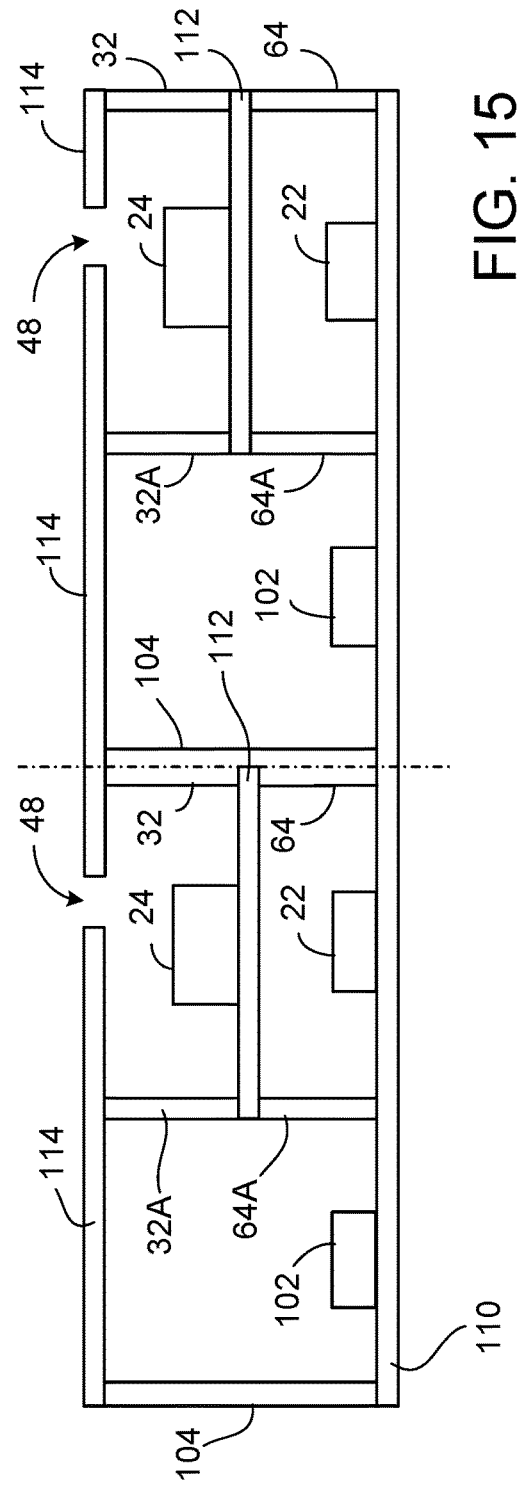

MEMS MICROPHONE MODULES AND WAFER-LEVEL TECHNIQUES FOR FABRICATING THE SAME

This disclosure relates to MEMS microphone modules and wafer-level fabrication techniques.

A microphone refers to a transducer or sensor that converts sound into electrical signals. One type of microphone that can be integrated into small electronic devices is fabricated as a micro-electromechanical system (MEMS) and sometimes is referred to as a MEMS microphone or a MEMS condenser microphone. Such microphones can provide superior sound quality and demonstrate greater heat tolerance than some other types of microphones, which facilitates the use of high-volume surface mount manufacturing techniques. MEMS microphones currently are incorporated into a wide range of consumer electronic and other products such as cellphones, laptops, headsets and media tablets, as well as gaming applications, cameras, televisions and hearing aids. In some cases, multiple microphones may be incorporated into a single electronic product. For example, multiple microphones are now being adopted in some smartphones for noise suppression, in which the cancellation of ambient sounds is important for handsets when carrying out voice commands. Likewise, some laptops have three microphones: two are used in the lid on each side of a Webcam to provide clear, noise free communication, and a third is used to suppress the noise from the keys on the keyboard.

In view of the increasingly widespread use of MEMS microphones in various electronic devices, it is desirable to find ways to improve manufacturing efficiency, reduce costs and reduce the size of the MEMS microphones.

SUMMARY

The present disclosure describes MEMS microphone modules and fabrication techniques that, at least in some implementations, address some or all of the foregoing issues.

For example, the disclosure describes various wafer-level fabrication techniques. A particular wafer-level method of fabricating multiple MEMS microphone modules includes providing a substrate wafer on which are mounted pairs of devices, each pair including a MEMS microphone device and an integrated circuit device to perform processing of signals from the MEMS microphone device. A cover wafer is provided over the substrate wafer to form a wafer stack, where the cover wafer and substrate wafer are separated by a spacer that serves as a wall surrounding respective pairs of devices. The method includes dividing the wafers into individual MEMS microphone modules each of which includes at least one of the MEMS microphone devices and an associated one of the integrated circuit devices, and wherein each MEMS microphone module has an opening through which sound can enter the MEMS microphone module. The disclosure describes other wafer-level fabrication techniques as well.

The disclosure also describes various MEMS microphone modules. For example, in one aspect, a MEMS microphone module includes a first substrate and a second substrate on which is mounted a MEMS microphone device. The second substrate is separated from the first substrate by a first spacer. An integrated circuit device is mounted on the first substrate and arranged to perform processing of signals from the MEMS microphone device. A cover is separated from the second substrate by a second spacer. The module has an opening in the cover or in the second spacer through which sound can enter.

According to another aspect, a MEMS microphone module includes a substrate, a MEMS microphone device mounted on a first surface of the substrate, and an integrated circuit device mounted on a second surface of the substrate, where the second surface is on an opposite side of the substrate from the first surface, and the integrated circuit device is arranged to perform processing of signals from the MEMS microphone device. A cover is separated from the substrate by a first spacer, and a second spacer is on the second surface of the substrate. The module has an opening in the cover or in the first spacer through which sound can enter.

Some implementations include acoustics-enhancing features on an inner surface of the second spacer or an inner surface of the cover. The acoustics-enhancing features can be composed, for example, of a polymer material, a foam material or a porous material. Some implementations include one or more projections extending from an exterior surface of the cover. The projections can be used, for example, to facilitate positioning of the MEMS microphone module within a housing of an electronic or other device.

One or more of the following advantages are provided in some implementations. For example, the MEMS microphone modules can, in some cases, improve reliability, performance or ease of manufacturing. The modules can be made to have a compact size with a relatively small footprint, which can be important for applications in which space is at a premium. Furthermore, the modules can be fabricated in wafer-level processes, which can facilitate the manufacture of multiple modules.

Other aspects, features and advantages will be readily apparent from the following detailed description, the accompanying drawings and the claims.

BRIEF DESCRIPTION OF THE DRAWINGS

FIGS. 2-4 illustrate steps in an example wafer-level fabrication process.

FIGS. 11-15 illustrate steps in an example wafer-level fabrication process.

DETAILED DESCRIPTION

Figure 1:
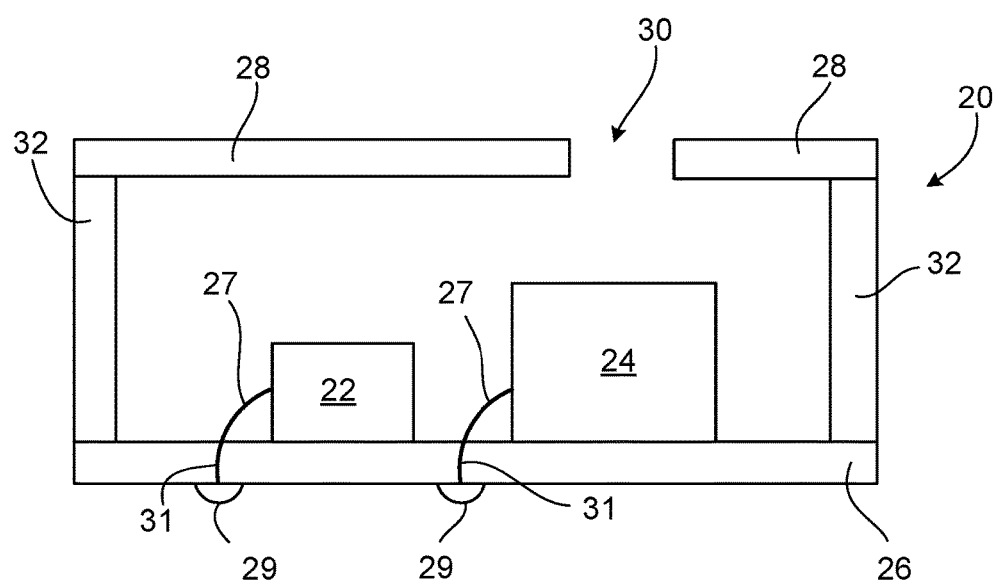
FIG. 1 illustrates a cross-section of an example of a MEMS microphone module.

As shown in FIG. 1, a MEMS microphone module 20 includes an integrated circuit (IC) 22 and a MEMS device 24 mounted on a printed circuit board (PCB) substrate 26.

Electrical wires 27 or electrical pads on the underside of IC 22 and MEMS device 24 can provide connections to PCB substrate 26. IC 22 can be implemented, for example, as a semiconductor chip device and can include circuitry that performs analog-to-digital processing of signals from MEMS device 24. The module 20 includes a cover 28 that includes an opening 30 to allow sound to enter the module. Cover 28 can be composed, for example, of a glass material, a plastic material or a printed circuit board (PCB) material such as FR4, which is a grade designation assigned to glass-reinforced epoxy laminate material. PCB substrate 26 and cover 28 are separated by spacers 32 that form sidewalls for the module. Spacers 32 may be formed as a single integral wall that surrounds MEMS microphone device 24 and IC 22.

Electrical contacts such as solder balls 29 or contact pads can be provided on the outer, bottom surface of PCB substrate 26. Conductive vias 31 can provide electrical connections from wiring 27 to solder balls 29. Module 20 can be mounted, for example, on a printed circuit board, e.g., using surface mount technology (SMT), next to other electronic components. The printed circuit board can be a constituent of an electronic device (e.g., a hand-held communication device such as a cellphone or smartphone), a laptop, a headset, a media tablet, an electronic product for a gaming application, a camera, a television or a hearing aid. Spacers 32 and cover 28 can be coated or lined with a conductive material to provide electromagnetic shielding.

Module 20 can be made relatively small. For example, in some implementations, module 20 has dimensions on the order of about 5 mm of less (width)×5 mm or less (length)×3 or less mm (height). For example, in a particular implementation, module 20 has dimensions on the order of about 3 mm (width)×3 mm (length)×1 mm (height). Different dimensions may be appropriate for other implementations.

Multiple MEMS microphone modules 20 can be fabricated at the same time, for example, in a wafer-level process. Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm.

In some implementations of a wafer-level process, there can be provisions for at least ten modules 20 in each lateral direction, and in some cases at least thirty or even fifty or more modules in each lateral direction. Examples of the dimensions of each of the wafers are: laterally at least 5 cm or 10 cm, and up to 30 cm or 40 cm or even 50 cm; and vertically (measured with no components arranged thereon) at least 0.2 mm or 0.4 mm or even 1 mm, and up to 6 mm or 10 mm or even 20 mm.

FIGS. 2-4 illustrate various steps in an example wafer-level fabrication process. As shown in FIG. 2, multiple ICs 22 and MEMS devices 24 are mounted on a PCB substrate wafer 40, for example, by pick-and-place equipment. Pairs of ICs 22 and MEMS devise 24 are spaced from one another in view of the lateral dimensions of modules. PCB substrate wafer 40 can comprise standard PCB materials (e.g., fiber glass or ceramic). Solder balls 29 can be provided on the side opposite the side on which ICs 22 and MEMS devise 24 are mounted. Conductive vias 31 can be provided through PCB substrate wafer 40 for electrical connection between wires 27 and the solder balls 29 on the exterior surface of the PCB substrate wafer.

Next, as illustrated in FIG. 3, spacers 42 are formed, for example, by a replication or vacuum injection technique. The spacers 42 can be replicated, for example, directly on PCB substrate wafer 40 (or on a cover wafer 46, described below) by a vacuum injection technique. In some implementations, spacers 42 are composed of a polymer material, for example, a hardenable (e.g., curable) polymer material, such as an epoxy resin. In other implementations, spacers 42 are made of a PCB material (e.g., fiber glass or ceramic). In some implementations, instead of using a direct replication by a vacuum injection technique to form spacers 42, a pre-formed spacer wafer is attached to PCB substrate wafer 40. The pre-formed spacer wafer can be formed, for example, by replication. The spacer wafer can include openings (i.e., through-holes) 44 such that, when the wafers are stacked on one another, ICs 22 and MEMS devices 24 are laterally encircled by sidewalls formed by the spacer wafer. In case of a PCB spacer wafer, openings 44 can be made, for example, by micromachining.

As illustrated in FIG. 4, cover wafer 46 is attached over spacers 42. Cover wafer 46 includes openings 48 which correspond to the opening 30 in FIG. 1. Openings 48 can be formed, for example, by micromachining or by a replication technique. Openings 48 may have a circular, square or other shape. The shape and size of openings 48 can be selected to achieve desired acoustics or sound propagation.

If a spacer wafer is used to provide spacers 42, then the wafers (i.e., PCB substrate wafer 40, spacer wafer and cover wafer 46) can be attached to one another, for example, by glue or some other adhesive to form a stack 49. In some implementations, the wafers can be attached to one another in a different order than the one described above. For example, cover wafer 46 can be attached to the spacer wafer to form a sub-stack, which subsequently is attached to PCB substrate wafer 40. As also noted above, in some implementations, spacers 42 are formed by a replication or vacuum injection technique, and may be formed directly on PCB substrate wafer 40 or cover wafer 46.

After stack 49 is formed, it is separated, for example, by dicing along imaginary lines 50 (see FIG. 4) into multiple individual modules 20, each of which includes an IC 22 and associated MEMS microphone 24, as shown in FIG. 1. If desired, the exterior surfaces of sidewalls 32 and cover 28 can be coated (or lined) with a conductive material to provide electromagnetic shielding of the components within module 20.

Figure 5:
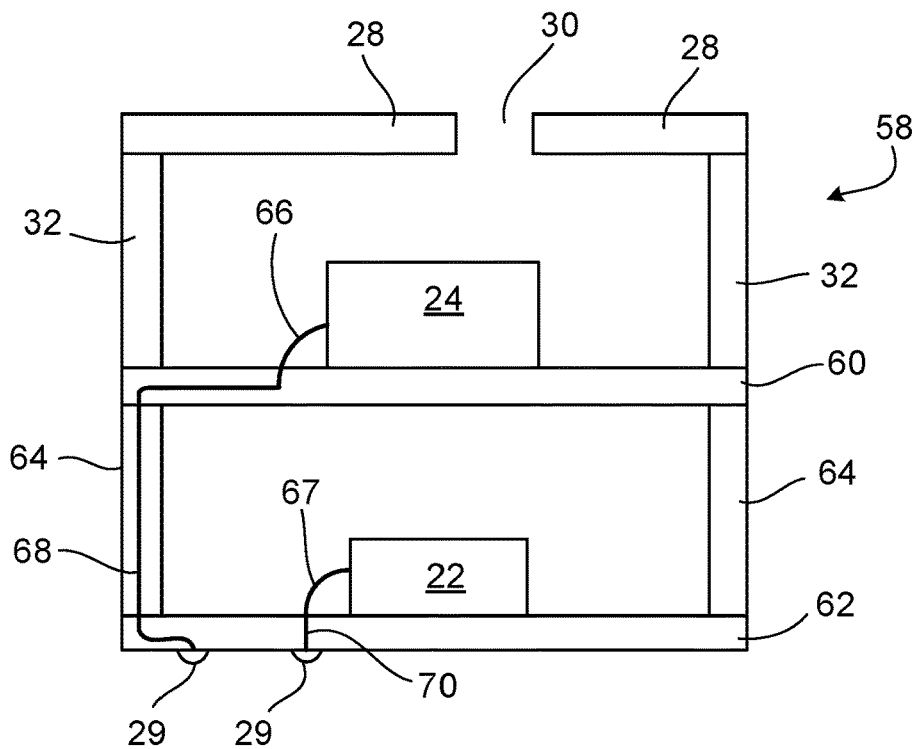
FIG. 5 illustrates another example of a MEMS microphone module.
Figure 6:
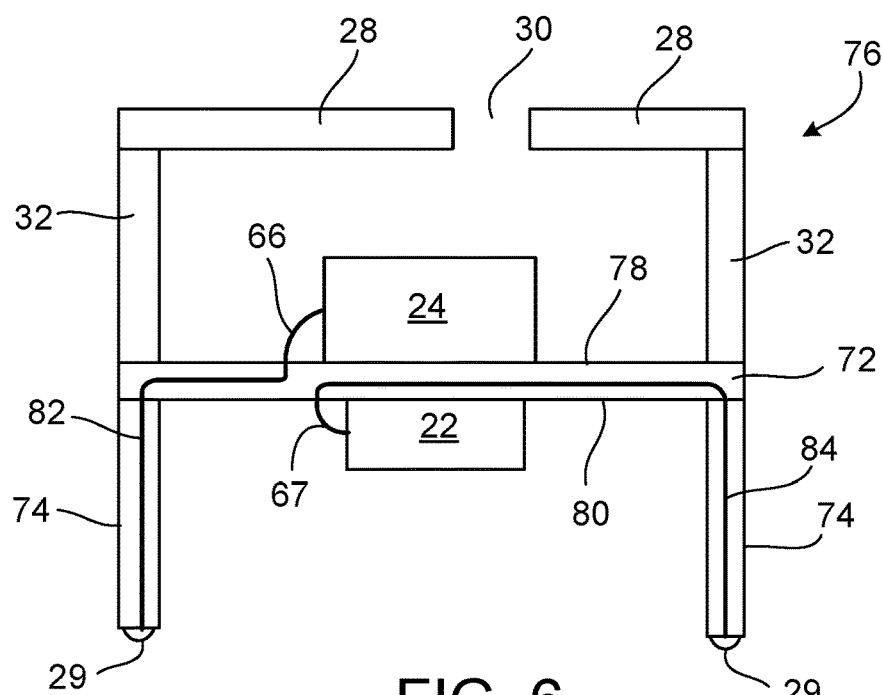
FIG. 6 illustrates yet another example of a MEMS microphone module.

The footprint (i.e., the area coverage) of module 20 is dictated, at least in part, by the combined footprints of IC 22 and MEMS device 24. FIGS. 5 and 6 illustrate examples of modules in which IC 22 and MEMS device 24 are disposed one over the other, rather than side-by-side. In some implementations, such arrangements can help reduce the overall footprint of the module.

For example, FIG. 5 shows an example of a module 58 in which IC 22 and MEMS device 24 are mounted on different PCB substrates 60, 62. In this example, the first PCB substrate 60, on which MEMS device 24 is mounted, is disposed between cover 28 and the second PCB substrate 62 (on which IC 22 is mounted). First spacers 32 separate cover 28 and first PCB substrate 60, and second spacers 64 separate first PCB substrate and second PCB substrate 62. Electrical connections 68 can extend from wiring 66 through first PCB substrate 60, through spacers 64 and through second PCB substrate 62 to provide electrical access to MEMS device 24 from outside module 58. Likewise, an electrical connection 70 can extend from wiring 67 through PCB substrate 62 to provide electrical access to IC 22 from outside module 58.

FIG. 6 illustrates an example of a module 76 in which both IC 22 and MEMS device 24 are mounted on opposite sides of the same PCB substrate 72. In the illustrated example, MEMS device 24 is mounted on surface 78, which is closer to cover 28, whereas IC 22 is mounted on the opposite side on surface 80. First spacers 32 separate cover 28 and PCB substrate 72 from one another, and second spacers 74 are attached to other side of PCB substrate 72. Electrical connections 82 can extend from wiring 66 through PCB substrate 72 and through spacers 74 to provide electrical access to MEMS device 24 from outside module 76. Likewise, electrical connections 84 can extend from wiring 67 through PCB substrate 72 and through spacers 74 to provide electrical access to IC 22 from outside module 76.

As illustrated in the example of FIGS. 5 and 6, portions of the electrical connections are embedded within spacer walls 64, 74. If a PCB spacer wafer is used to provide spacers 64, 74, then electrical connections 68, 70, 82, 84 can be formed, for example, using a plated through-hole (PTH) conductive via process. Electrical connections 68, 70, 82, 84 can be provided, for example, by a plating process using a conductive metal or metal alloy such as copper (Cu), gold (Au), nickel (Ni), tin-silver (SnAg), silver (Ag) or nickel-palladium (NiPd). Other metals or metal alloys may be used in some implementations as well. Furthermore, in some implementations, some or all of the electrical connections are provided on the outer surface of spacers, for example as a conductive coating or conductive tracks, conductive tape, or conductive glue.

The implementations of FIGS. 5 and 6 can reduce the overall footprint of the module. Modules 58, 76 can be made relatively small. For example, in some implementations, the modules have dimensions on the order of about 3 mm or less (width)×2.5 mm or less (length)×3 or less mm (height). For example, in a particular implementation, the modules have dimensions on the order of about 2 mm (width)×1.5 mm (length)×2 mm (height). Different dimensions may be appropriate for other implementations. In addition, the implementation of FIG. 6 can reduce the amount of material needed to fabricate the module because only a single PCB substrate 72 is needed (rather than two PCB substrates 60, 62 as in the implementation of FIG. 5).

Figure 7:
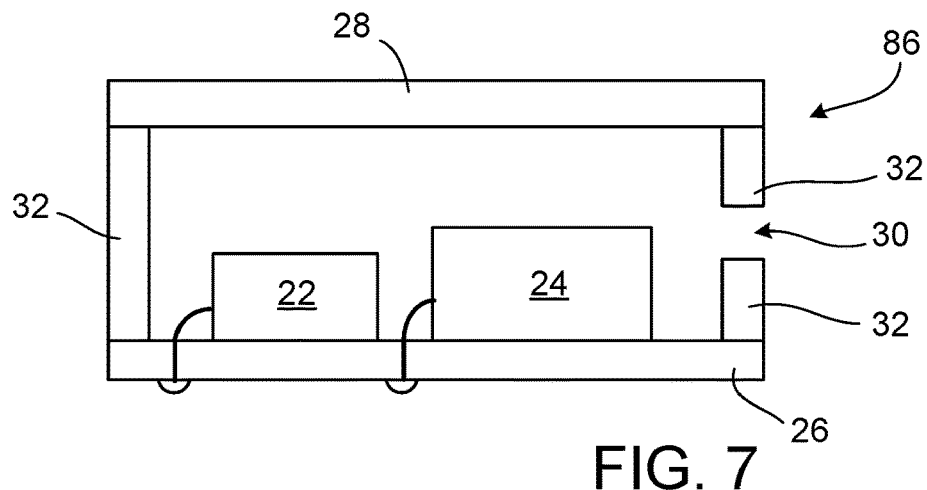
FIGS. 7, 8 and 9 illustrates further examples of MEMS microphone modules.
Figure 8:
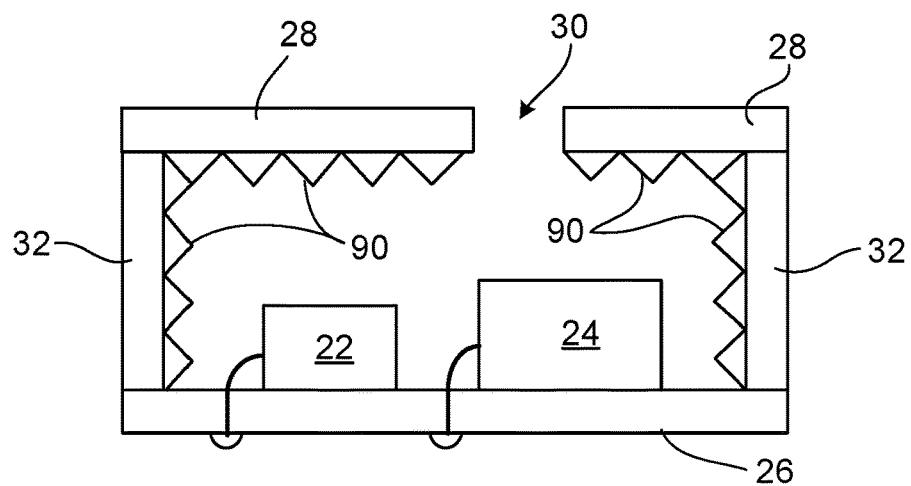
Figure 9:
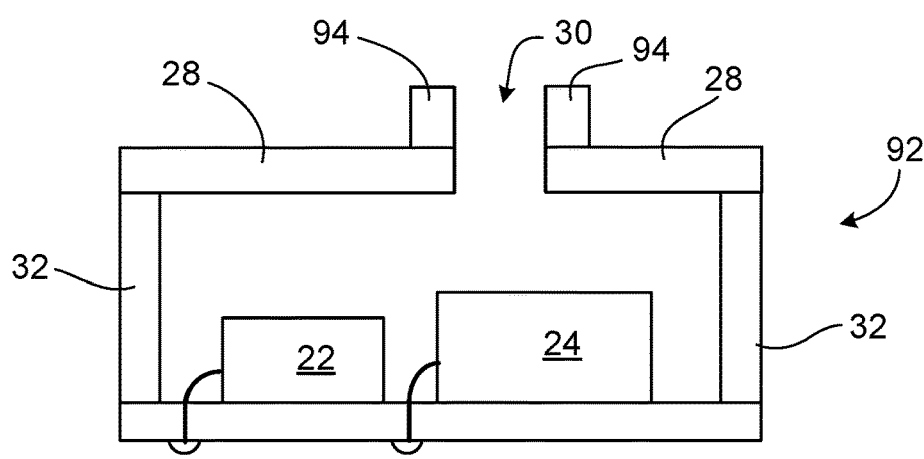

FIGS. 7, 8 and 9 illustrate various modifications that can be made to module 20 of FIG. 1. For example, the module 86 of FIG. 7 includes an opening 30 in one of the spacer sidewalls 32 instead of in cover 28. As part of the fabrication of module 86, spacers 32 can be formed, for example, by replication on PCB substrate 26 and cover 28. Providing opening 30 in one of spacer sidewalls 32 can be implemented in the embodiments of FIGS. 5 and 6, as well. In particular, opening 30 can be provided in spacer 32.

FIG. 8 illustrates a module 88 that includes acoustics-enhancing features 90 on inner surfaces of cover 28 and/or spacer sidewalls 32. Acoustics-enhancing features 90 can be shaped and sized to impact the acoustics or sound propagation in a pre-defined manner. Acoustics-enhancing features 90 on cover 28 can be formed, for example, by a replication or vacuum injection technique. Acoustics-enhancing features 90 on spacers 32 can be formed, for example, by injection molding or by replication. The replication tool for making the cover wafer and spacer wafer can include provisions for forming the acoustics-enhancing features 90, which can be composed, for example, of a polymer, foam or porous material. Acoustics-enhancing features 90 can be implemented in the embodiments of FIGS. 5 and 6, as well. In particular, acoustics-enhancing features 90 can be provided on the inner surfaces of spacers 32 and/or cover 28.

FIG. 9 illustrates a module 92 that includes alignment or positioning features 94 in the form of small projections that extend from the outer surface of cover 28. In the illustrated example, alignment features 94 are located adjacent opening 30; however, in other implementations they may be located elsewhere on the outer surface of cover 28. In some implementations, a single projection surrounds opening 30 to form position feature 94, whereas other implementations include multiple projections. Features 94 can be used to facilitate positioning of the MEMS microphone module within the housing of an electronic or other device. Alignment features 94 can be fabricated, for example, by a replication technique or by micromachining. Alignment features 90 can be implemented in the embodiments of FIGS. 5, 6, 7 and 8 as well.

More than one of the various features of FIGS. 7-9 (i.e., an opening 30 in a spacer sidewall 32; acoustics-enhancing features 90; and/or alignment features 94) can be incorporated into the same MEMS microphone module. Thus, the modifications illustrated in FIGS. 8, 9 and 10 can be used separately or in combination with the features of other modules described in this disclosure. The foregoing MEMS microphone modules can be fabricated in a wafer-level process.

To improve the acoustics or sound propagation in the MEMS microphone modules, polymer materials with mineral fillers and/or foam materials can be used for one or more of the spacers 32, the internal acoustics-enhancing features 90 or the cover 28.

Figure 10:
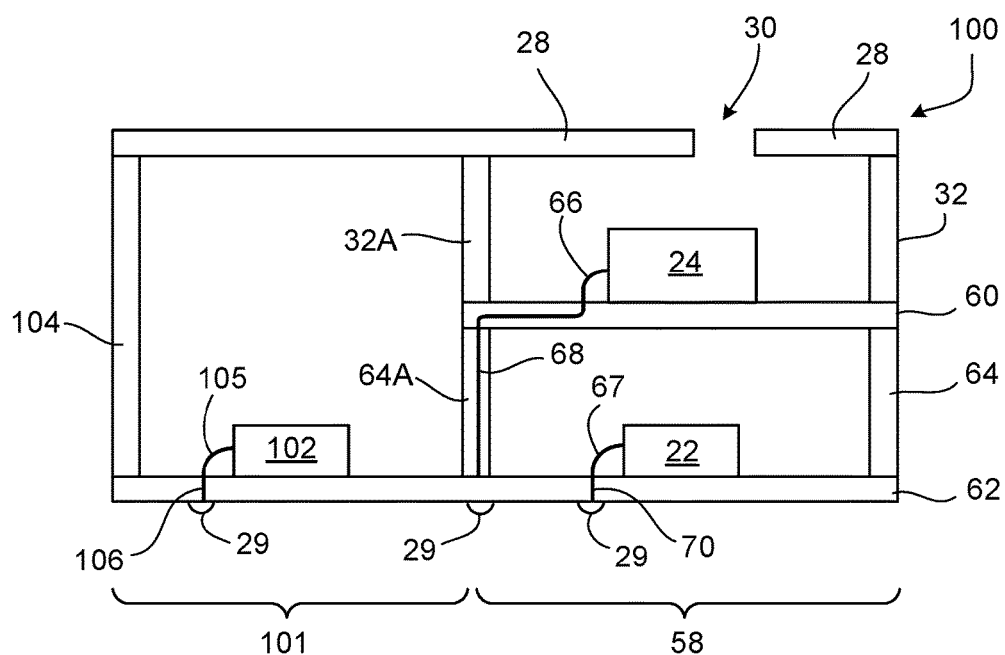
FIG. 10 illustrates an example of a MEMS microphone module combined with a flash module.

The foregoing MEMS microphone modules can be integrated with other small modules (e.g., a LED flash module, or sensors, such as ambient light sensors) to help reduce the overall footprint of the modules even further. For example, FIG. 10 illustrates an example of a module 100 that combines the MEMS microphone module 58 of FIG. 5 with a LED flash module 101 to form a single integrated module in which MEMS microphone module 58 and LED flash module 101 are disposed side-by-side and share spacers 32A, 64A in common. Spacers 32A, 64A serve as walls that separate the modules 58, 101 from one another.

In the illustrated example of FIG. 10, flash module 101 includes a LED device 102 mounted on PCB substrate 62. Wiring 105 and electrical connection 106 connect LED device 102 to a solder ball 29 on the outer surface of PCB substrate 62. Electrical connection 106 can be formed, for example, using a plated through-hole (PTH) conductive via process as described above.

Although FIG. 10 shows a cover 28 having the same structure for the MEMS microphone portion and for LED flash portion, in some implementations, cover 28 can be structured differently for those portions. For example, cover 28 can incorporate a lens or diffuser for the LED flash portion.

Module 100 of FIG. 10 also can be fabricated, for example, in a wafer-level process, an example of which is illustrated by FIGS. 11-15. As shown in FIG. 11, multiple ICs 22 and LED devices 102 are mounted on a first PCB substrate wafer 110, for example, by pick-and-place equipment. ICs 22 and LED devices 102 are spaced from one another in view of the lateral dimensions of the modules.

As illustrated in FIG. 12, spacers 64, 64A and 104 are formed, for example, by a replication or vacuum injection technique. In some implementations, spacers 64 and 104 are formed as a single spacer, which is diced vertically during subsequent processing (see FIG. 15). Spacers 64, 64A can be replicated directly on first PCB substrate wafer 110 or on second PCB substrate 112, described below. Likewise, spacers 104 can be replicated directly on first PCB substrate wafer 110 or on cover wafer 114, described below. Alternatively, the spacers can be provided by wafers that are glued or otherwise attached to PCB wafers 110, 112 and cover wafer 114. The spacers can be composed of a polymer material, for example, a hardenable (e.g., curable) polymer material, such as an epoxy resin. In other implementations, the spacers are composed of a PCB material (e.g., fiber glass or ceramic).

As illustrated in FIG. 13, MEMS microphone devices 24 are mounted on a second PCB substrate wafer 112, which is attached over first PCB substrate 110 such that ICs 22 are housed in an area between first and second PCB substrates 110, 112. Spacers 64, 64A serve as sidewalls surrounding respective ICs 22. Second PCB substrate 112 has openings corresponding to the area above each LED device 102.

As illustrated in FIG. 14, spacers 32, 32A also can be formed, for example, by a replication or vacuum injection technique. Spacers 32, 32A can be replicated directly on second PCB substrate wafer 112 or on cover wafer 114. The spacers can be composed of a polymer material, for example, a hardenable (e.g., curable) polymer material, such as an epoxy resin. In other implementations, the spacers are composed of a PCB material (e.g., fiber glass or ceramic).

As shown in FIG. 15, cover wafer 114 then is attached over second PCB substrate 112. Cover wafer 112 includes openings 48 each of which corresponds to opening 30 in FIG. 5. As explained above, openings 48 can be formed, for example, by micromachining or by a replication technique, and can have a shape and size selected to achieve desired acoustics or sound propagation. In some implementations, cover wafer 114 has different sections composed of different materials that correspond to the various functions of the combined module (e.g., a diffuser for the LED flash portion). The stack of wafers 110, 112, 114 then can be separated (e.g., by dicing) into multiple modules similar to module 100 in FIG. 10.

Exterior connections (e.g., solder balls or contact pads also can be provided for the implementations of FIGS. 10-15 as described above. In addition, if a PCB spacer wafer is used to provide spacers 64, 64A, plated through-hole (PTH) conductive vias can be provided as described above.

Figure 16:
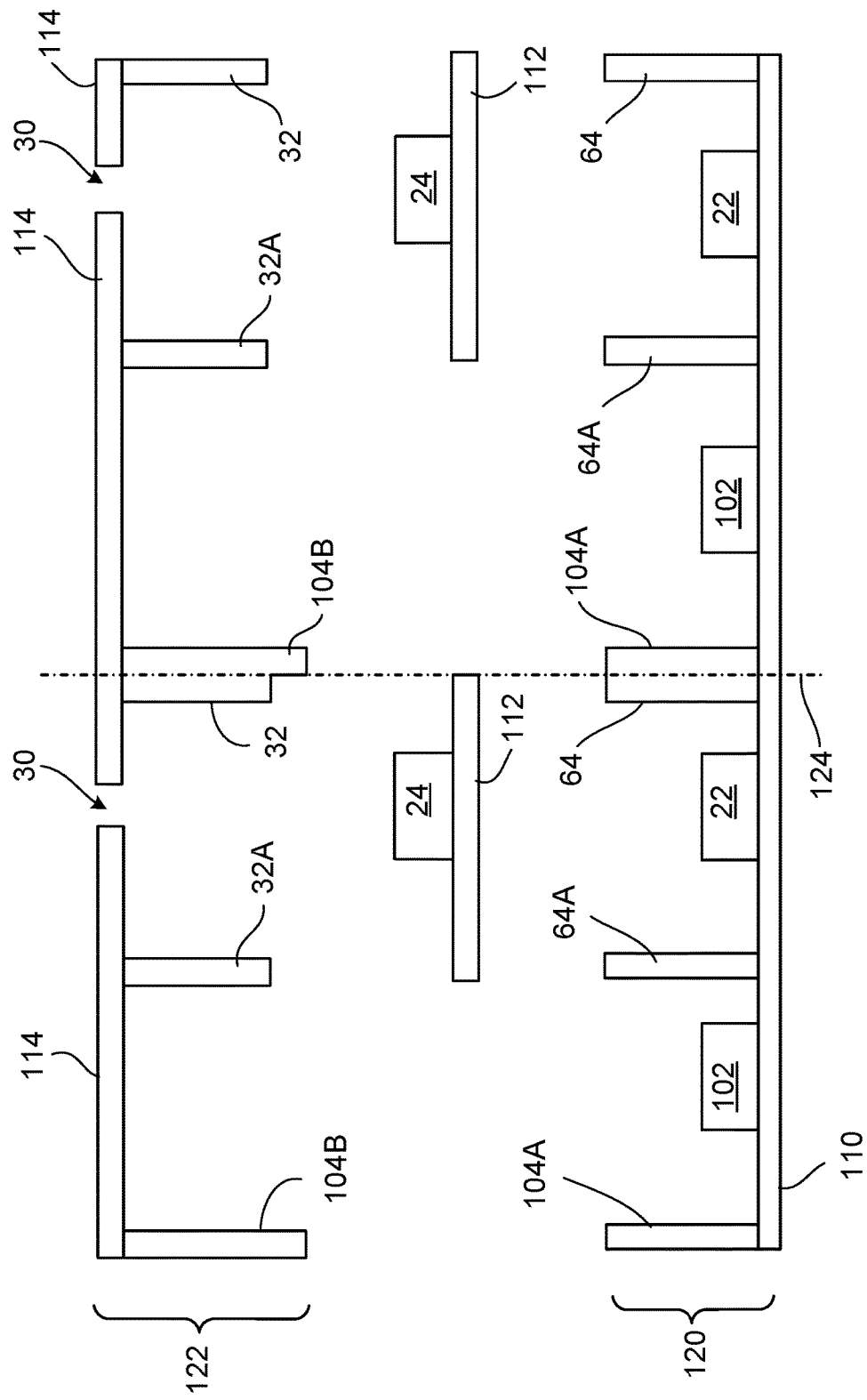
FIG. 16 illustrates another example of a wafer-level fabrication process.

FIG. 16 illustrates another wafer-level technique for fabricating module 100 of FIG. 10. In this example, a first sub-stack 120 is formed by providing spacers 64, 64A and spacer elements 104A on first PCB substrate wafer 110 (e.g., by replication (separate spacer wafer) or vacuum injection (replication directly on substrate)). Spacer elements 104A correspond to roughly the bottom half of spacers 104 in FIG. 10. In this example, spacer elements 104A have about the same height as spacers 64, 64A. In some implementations, spacers 64 and 104A are formed as a single spacer, which is diced vertically during subsequent processing (see dicing line 124).

A second sub-stack 122 is formed by providing spacers 32, 32A and spacer elements 104B on cover wafer 114. Spacer elements 104B correspond to roughly the top half of spacers 104 in FIG. 10. In this example, spacer elements 104B are slightly longer than spacers 32, 32A (i.e., by an amount equal to the thickness of second substrate wafer 112. In some implementations, spacers 32 and 104B are formed as a single spacer, which is diced vertically during subsequent processing (see dicing line 124).

The various spacers and spacer elements in FIG. 16 can be formed, for example, by replication directly on first substrate wafer 110 and cover wafer 114, or by providing a separate spacer wafer, as appropriate.

To complete the wafer stack, second substrate wafer 112 (with MEMS devices 24 mounted thereon) is attached (e.g., by glue or some other adhesive) to first sub-stack 120. In particular, the underside of second substrate wafer 112 is attached to spacers 64, 64A, thereby forming an intermediate stack. Then, second sub-stack 122 is attached to the intermediate stack. In particular, spacer elements 104B of the second sub-stack 122 are attached (e.g., by glue or some other adhesive) to corresponding spacer elements 104A of the first sub-stack 120, and spacers 32, 32A are attached (e.g., by glue or some other adhesive) to the upper side of second substrate wafer 112. The resulting wafer stack, which appears similar to FIG. 15, then can be separated (e.g., by dicing) into multiple modules similar to module 100 in FIG. 10. Exterior connections (e.g., solder balls or contact pads), as well as plated through-hole (PTH) conductive vias, also can be provided, for example, as described above.

Figure 17:
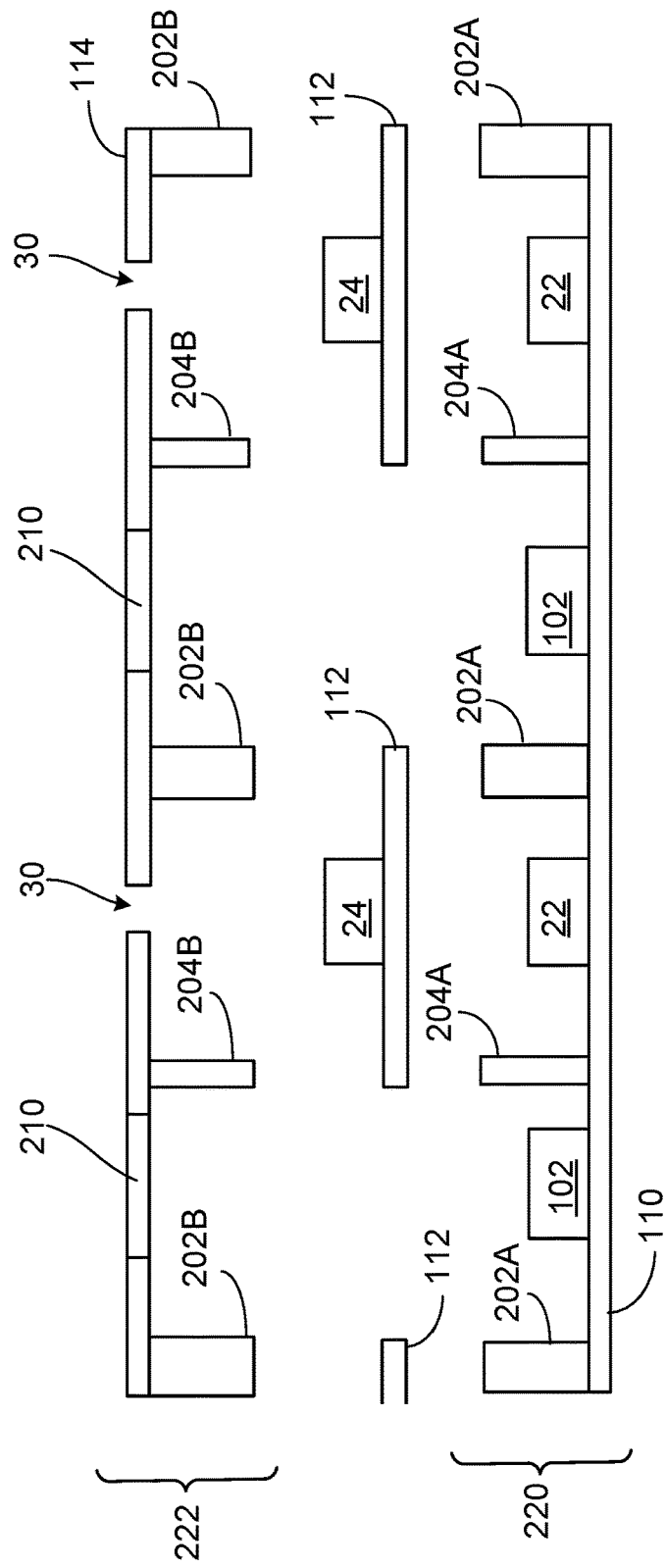
FIG. 17 illustrates a further example of wafer-level fabrication process.
Figure 18:
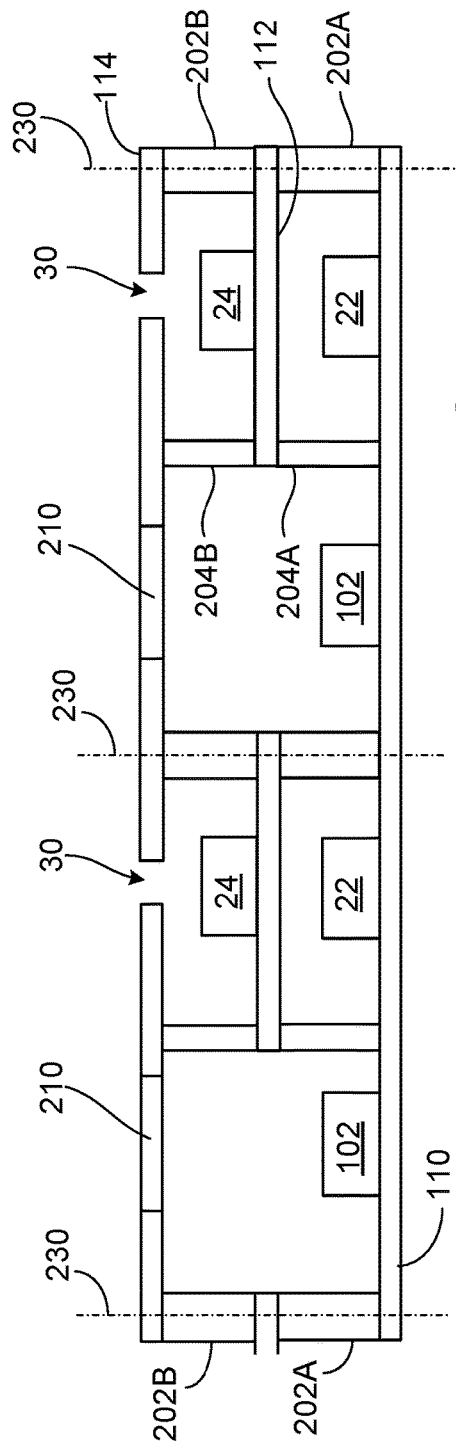
FIG. 18 illustrates a wafer stack resulting from the process of FIG. 17.

FIGS. 17-18 illustrate yet a further wafer-level technique for fabricating MEMS microphone modules. In this example, a first sub-stack 220 is formed by providing spacers elements 202A, 204A on first PCB substrate wafer 110. The spacer elements 204A have the same height as spacer elements 202A. A second sub-stack 222 is formed by providing spacer elements 202B, 204B on cover wafer 114 The spacer elements 204B have the same height as spacer elements 202B. The spacer elements in FIG. 17 can be formed, for example, by replication directly on first substrate wafer 110 and cover wafer 114, or by providing separate spacer wafers. In addition to openings 30, the cover wafer 114 may include lenses or other beam shaping elements 210 at spaced intervals. When the wafers are stacked, each lens 210 is disposed over a respective one of the LED devices 102.

Figure 19:
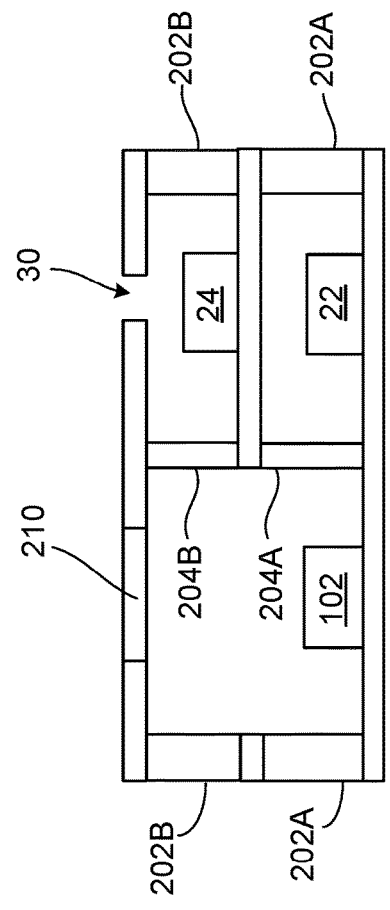
FIG. 19 is an example of a MEMS microphone module obtained after separating the stack of FIG. 18.

To form the wafer stack, a second substrate wafer 112 (with MEMS devices 24 mounted thereon) is attached (e.g., by glue or some other adhesive) to first sub-stack 220. In particular, the underside of second substrate wafer 112 is attached to spacers 202A, 204A, thereby forming an intermediate stack. Then, second sub-stack 222 is attached to the intermediate stack. In particular, spacer elements 202B, 204B of the second sub-stack 222 are attached (e.g., by glue or some other adhesive) to the MEM-side of the second substrate wafer 112, and spacers elements 202A, 204A are attached (e.g., by glue or some other adhesive) to the opposite side of second substrate wafer 112. The resulting wafer stack (see FIG. 18) then can be separated (e.g., by dicing along lines 230) into multiple modules, one of which is shown in FIG. 19. Exterior connections (e.g., solder balls or contact pads), as well as plated through-hole (PTH) conductive vias, also can be provided, for example, as described above.

Although FIGS. 10-19 illustrate examples in which small MEMS microphone modules are combined with flash LED modules, the MEMS microphone modules can be combined with other small modules, including, for example, proximity sensor modules, time-of-flight (TOF) modules and camera modules. Thus, LED flash module 101 of FIG. 10 can be replaced by one of these other types of modules in some implementations. By combining the MEMS microphone module with one or more other modules, the overall footprint of the modules can be reduced, thereby allowing the modules to be integrated into small consumer electronic or other products (e.g., cellphones, laptops, headsets and media tablets, gaming applications, cameras, televisions and hearing aids) in which space is at premium.

Various modifications can be made within the scope of the invention. Accordingly, other implementations are within the scope of the claims.

What is claimed is:

1. A module comprising:
a MEMS microphone module including:
a first substrate;
a second substrate on which is mounted a MEMS microphone device, wherein the second substrate is separated from the first substrate by a first spacer;
an integrated circuit device mounted on the first substrate and arranged to perform processing of signals from the MEMS microphone device; and
a cover separated from the second substrate by a second spacer;
an opening in the cover or in the second spacer through which sound can enter; and
a second module joined to the MEMS microphone module, wherein the second module and the MEMS microphone module are side-by-side, and wherein interior regions of the second module and the MEMS microphone module are separated from one another by the first and second spacers.

2. The module of claim 1 wherein the MEMS microphone module and the second module share the first substrate in common.

3. The module of claim 2 further including an optoelectronic device mounted on the first substrate as part of the second module.

4. The module of claim 1 wherein the MEMS microphone module and the second module share the cover in common.

5. The module of claim 1 wherein the second module includes a third spacer that separates the first substrate from the cover.

6. A MEMS microphone module comprising:
a substrate;
a MEMS microphone device mounted on a first surface of the substrate;
an integrated circuit device mounted on a second surface of the substrate, wherein the second surface is on an opposite side of the substrate from the first surface, the integrated circuit device being arranged to perform processing of signals from the MEMS microphone device; and
a cover separated from the substrate by a first spacer;
a second spacer on the second surface of the substrate; and
an opening in the cover or in the first spacer through which sound can enter.

7. The MEMS microphone module of claim 6 including acoustics-enhancing features on at least one of an inner surface of the first spacer or an inner surface of the cover.

8. The MEMS microphone module of claim 7 wherein the acoustics-enhancing features are composed of a polymer material, a foam material or a porous material.

9. The MEMS microphone module of claim 6 including one or more projections extending from an exterior surface of the cover.

10. The MEMS microphone module of claim 9 wherein the opening is in the cover and the one or more projections are located adjacent the opening.

11. A wafer-level method of fabricating a plurality of MEMS microphone modules, the method comprising:
providing a first sub-stack that includes first spacer elements on a first side of a first substrate, the first side of the first substrate also including light emitting devices and integrated circuits mounted thereon, wherein each light emitting device and integrated circuit is surrounded laterally by respective ones of the spacer elements;
attaching a second substrate to the first spacer elements, wherein MEMS microphone devices are mounted on a surface of the second substrate, the second substrate not extending over the light emitting devices;
providing a second sub-stack that includes second spacer elements on a first side of a cover wafer; and
attaching the second spacer elements of the second sub-stack to the surface of the second substrate on which the MEMS microphone devices are mounted.

12. The method of claim 11 wherein the first sub-stack, the second substrate and the second sub-stack form a stack, the method further including separating the stack into a plurality of modules, each of which includes a light emitting element, an integrated circuit and a MEMS microphone device.

* * * * *